(12) United States Patent
Boivin et al.

(10) Patent No.: US 11,800,821 B2
(45) Date of Patent: Oct. 24, 2023

(54) PHASE-CHANGE MEMORY WITH AN INSULATING LAYER ON A CAVITY SIDEWALL

(71) Applicants: STMicroelectronics (Crolles 2) SAS, Crolles (FR); STMICROELECTRONICS (ROUSSET) SAS, Rousset (FR)

(72) Inventors: Philippe Boivin, Venelles (FR); Daniel Benoit, Grenoble (FR); Remy Berthelon, Saint Martin d'Heres (FR)

(73) Assignees: STMicroelectronics (Crolles 2) SAS, Crolles (FR); STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 17/856,711

(22) Filed: Jul. 1, 2022

(65) Prior Publication Data

US 2022/0336736 A1    Oct. 20, 2022

Related U.S. Application Data

(62) Division of application No. 16/879,577, filed on May 20, 2020, now Pat. No. 11,411,177.

(51) Int. Cl.
*H10N 70/20*      (2023.01)
*H10B 63/00*      (2023.01)
*H10N 70/00*      (2023.01)

(52) U.S. Cl.
CPC ........... *H10N 70/231* (2023.02); *H10B 63/30* (2023.02); *H10N 70/021* (2023.02); *H10N 70/826* (2023.02)

(58) Field of Classification Search
CPC .. H10N 70/231; H10N 70/021; H10N 70/826; H10N 70/011; H10N 70/8413; H10N 70/801; H10B 63/30; H10B 63/82; H01L 45/1233; H01L 45/16; H01L 45/06; H01L 45/126; H01L 45/12; H01L 27/2436; H01L 27/2472; H01L 45/1608
See application file for complete search history.

(56) References Cited

U.S. PATENT DOCUMENTS

| 6,462,984 | B1 | 10/2002 | Xu et al. |
| 7,244,956 | B2 | 7/2007 | Pellizzer |
| 7,422,926 | B2 | 9/2008 | Pellizzer et al. |
| 7,745,809 | B1 * | 6/2010 | Sutardja ............... H10N 70/063 257/734 |

(Continued)

FOREIGN PATENT DOCUMENTS

FR          3 066 038 A1      11/2018

*Primary Examiner* — Caleb E Henry
(74) *Attorney, Agent, or Firm* — SEED IP LAW GROUP LLP

(57) ABSTRACT

The present disclosure concerns a phase-change memory manufacturing method and a phase-change memory device. The method includes forming a first insulating layer in cavities located vertically in line with strips of phase-change material, and anisotropically etching the portions of the first insulating layer located at the bottom of the cavities; and a phase-change memory device including a first insulating layer against lateral walls of cavities located vertically in line with strips of phase-change material.

20 Claims, 5 Drawing Sheets

(56) References Cited

U.S. PATENT DOCUMENTS

| | | | |
|---|---|---|---|
| 2002/0058389 A1* | 5/2002 | Wicker | H10N 70/826 |
| | | | 257/E27.081 |
| 2005/0024933 A1* | 2/2005 | Pellizzer | H10B 63/32 |
| | | | 365/163 |
| 2006/0166455 A1* | 7/2006 | Gordon | G11C 11/5678 |
| | | | 438/130 |
| 2007/0029676 A1 | 2/2007 | Takaura et al. | |
| 2007/0057341 A9 | 3/2007 | Pellizzer | |
| 2007/0111440 A1 | 5/2007 | An et al. | |
| 2010/0163832 A1* | 7/2010 | Kau | H10N 70/8265 |
| | | | 438/102 |
| 2010/0165719 A1* | 7/2010 | Pellizzer | G11C 11/56 |
| | | | 365/210.1 |
| 2012/0248398 A1* | 10/2012 | Liu | H10B 63/34 |
| | | | 257/E45.001 |
| 2018/0090542 A1* | 3/2018 | Gourvest | H10B 63/82 |
| 2019/0288192 A1* | 9/2019 | Takahashi | H10N 70/8616 |
| 2020/0381617 A1* | 12/2020 | Boivin | H10B 63/30 |
| 2020/0395408 A1* | 12/2020 | Takahashi | H10B 63/845 |

* cited by examiner

PHASE-CHANGE MEMORY WITH AN INSULATING LAYER ON A CAVITY SIDEWALL

BACKGROUND

Technical Field

The present disclosure generally concerns electronic devices and, more specifically, phase-change memories.

Description of the Related Art

Memories are generally in the form of arrays, comprising word lines and bit lines. A memory cell containing binary information is located at each crossing of a word line and of a bit line.

In a phase-change memory, each memory cell comprises a strip of phase-change material having its lower portion in contact with a resistive element. Phase-change materials are materials which can switch from a crystal phase to an amorphous phase, and conversely. Such a switching is caused by an increase in the temperature of the underlying resistive element through which an electric current is conducted. The electric resistance difference between the amorphous phase of the material and its crystal phase is used to define two memory states, arbitrarily 0 and 1.

In the example of a phase-change memory, the memory cells are, for example, controlled by selection transistors, which conduct or not the current used to heat the resistive elements. The memory cells belonging to a same bit line are interconnected by a conductor covering the phase-change material and the memory cells belonging to a same word line are interconnected by a terminal of the transistors common to all the transistors of a same word line.

The binary information of a memory cell of a phase-change memory is, for example, accessed to, or read out, by measuring the resistance between the bit line and the word line of the memory cell.

BRIEF SUMMARY

Various embodiments disclosed herein overcomes disadvantages of known phase-change memories.

An embodiment provides a method of manufacturing a phase-change memory comprising forming a first insulating layer in cavities located vertically in line with strips of phase-change material; and anisotropically etching portions of the first insulating layer located at the bottom of the cavities.

An embodiment provides a phase-change memory device comprising a first insulating layer against lateral walls of cavities located vertically in line with strips of phase-change materials.

According to an embodiment, each strip of phase-change material is covered with a conductive strip.

According to an embodiment, the cavities are formed in a second insulating layer and reach the upper surface of conductive strips.

According to an embodiment, the method comprises the steps of forming selection transistors inside and on top of a silicon layer; forming first vias and second vias for contacting the transistors, through a third insulating layer; forming resistive elements vertically in line with said first vias; forming the strips of phase-change material; forming the conductive strips on the strips of phase-change material; forming the second insulating layer; and forming said cavities in the second insulating layer.

According to an embodiment, at least one cavity comprises a secondary cavity, at least a portion of one of the walls of the secondary cavity being made of a phase-change material.

According to an embodiment, a portion of one of the walls of at least one secondary cavity is formed by a resistive element.

According to an embodiment, at least one secondary cavity is filled with the first insulating layer.

According to an embodiment, the cavities are filled with conductive material to form contacts.

According to an embodiment, at least some of the contacts are conductive vias.

According to an embodiment, at least some of the contacts are conductive bars.

According to an embodiment, the thickness of the first insulating layer is greater than the thickness of the conductive strips.

According to an embodiment, the thickness of the first insulating layer is in the range from approximately 2 nm to approximately 5 nm.

The foregoing and other features and advantages will be discussed in detail in the following non-limiting description of specific embodiments in connection with the accompanying drawings.

DETAILED DESCRIPTION

Figure 1A:
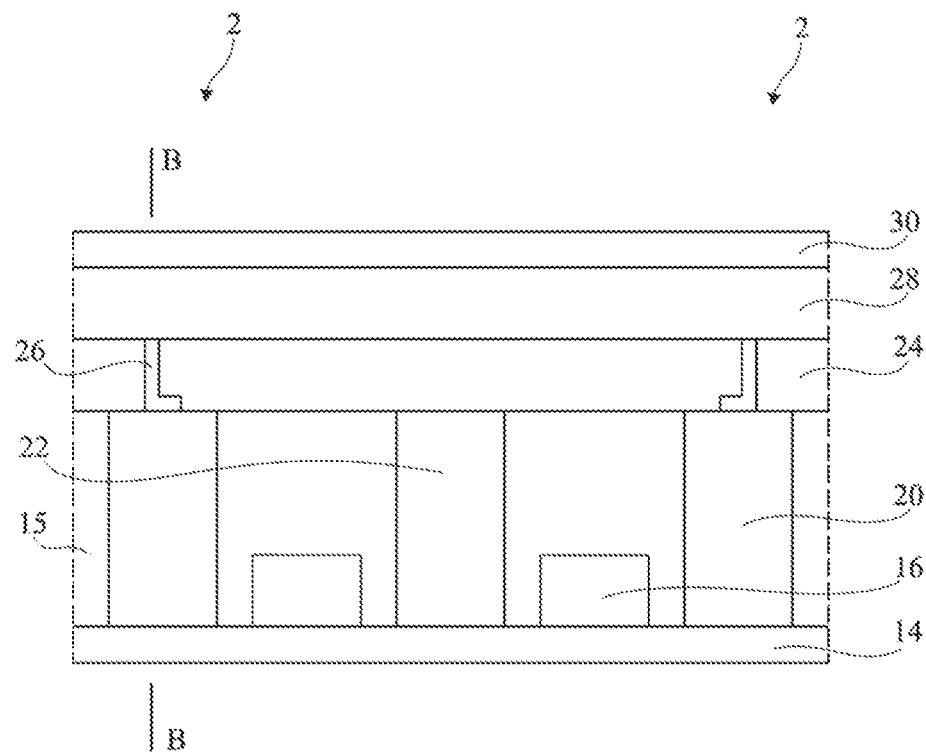
FIG. 1A comprises a cross-section view along plane A-A of FIG. 1B.

The same elements have been designated with the same reference numerals in the different drawings. In particular, the structural and/or functional elements common to the different embodiments may be designated with the same reference numerals and may have identical structural, dimensional, and material properties.

For clarity, those steps and elements which are useful to the understanding of the described embodiments have been shown and are detailed. In particular, the other electronic components contained in the memory are not detailed.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "approximately", "substantially", and "in the order of" are used herein to designate a tolerance of plus or minus 10%, or of plus or minus 5%, of the value in question.

FIGS. 1A, 1B, 2A, 2B, 3A, 3B, 4A, 4B, 5A, and 5B show results of successive steps of an embodiment of a phase-change memory manufacturing method.

Figure 1B:
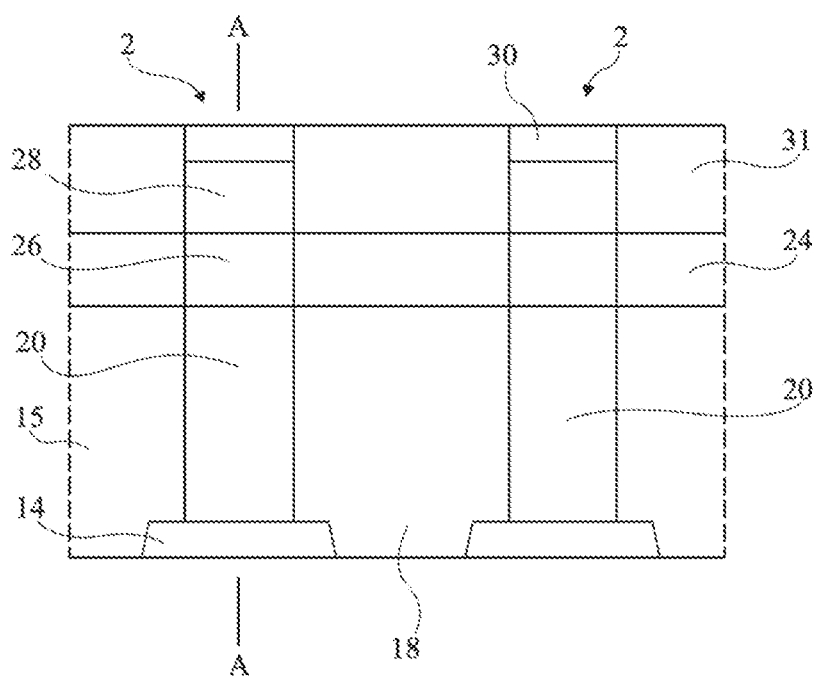
FIG. 1B comprises a cross-section view along plane B-B of FIG. 1A, illustrating the result of a step of an embodiment of a method of manufacturing a phase-change memory.

FIG. 1A comprises a cross-section view along plane A-A of FIG. 1B and FIG. 1B comprises a cross-section view along plane B-B of FIG. 1A, illustrating the result of a step of an embodiment of a phase-change memory manufacturing method. More particularly, FIG. 1A is a cross-section view in the direction of a bit line and FIG. 1B is a cross-section view in the direction of a word line. FIGS. 1A and 1B each show two memory cells 2.

The memory comprises a layer 14. Layer 14 is, for example, a substrate made of a semiconductor material, for example, of silicon. Layer 14 is, for example, a portion of a solid substrate. Layer 14 may also be a silicon layer covering an insulating layer in a so-called SOI (silicon on insulator) structure.

Layer 14 is covered with an insulating layer 15. Selection transistors 16 are formed inside and on top of layer 14. Selection transistors 16 are shown in FIG. 1A by their gates located in layer 15. The transistors 16 of the different bit lines are separated from one another by insulating trenches 18 (shown in FIG. 1B) extending through layer 14.

Contacts (or vias) 20 and 22 cross insulating layer 15 to contact and be electrically coupled to the source and drain areas of selection transistors 16.

Layer 15 is covered with an insulating layer 24 capable of comprising a plurality of types of insulator. Resistive elements 26 extend in layer 24 between contacts 20 and strips or layers 28 of phase-change material. Each strip 28 is covered with a strip or layer 30 of conductive material, having horizontal dimensions substantially equal to the horizontal dimensions of strip 28. The resistive elements 26, the strip 28, and the strip 30 of a same bit line are, for example, etched together.

The resistive elements have, in this example, an L-shaped profile. More particularly, in the embodiment of shown in FIGS. 1A and 1B, resistive elements 26 have an L-shaped cross-section in the cross-section plane of view (shown in FIG. 1A). Stated differently, in one embodiment, each of the resistive elements 26 includes a first portion that extends in a first direction (e.g., horizontal direction in FIG. 1A) and a second portion that extends in a second direction transverse to the first direction (e.g., vertical direction in FIG. 1B).

Each bit line comprises a strip 28 which is common to the entire bit line and which is in contact with the resistive elements 26 of the entire bit line. Similarly, each bit line comprises a strip 30 of conductive material covering strip 28. The strips 28 and 30 of the different bit lines are laterally insulated from one another by insulator regions 31.

Contacts 22 are, for example, in contact with a source or drain area common to two neighboring transistors 16 of a same bit line. The contacts 22 of a same word line are interconnected, for example, by a conductive bar.

Thus, to store a value in a memory cell, a voltage is applied between the layer 30 of the bit line associated with the memory cell and the contact 20 of the word line, while turning on the selection transistor 16 located between the contact 22 of the memory cell and the contact 20 of the word line.

Figure 2A:
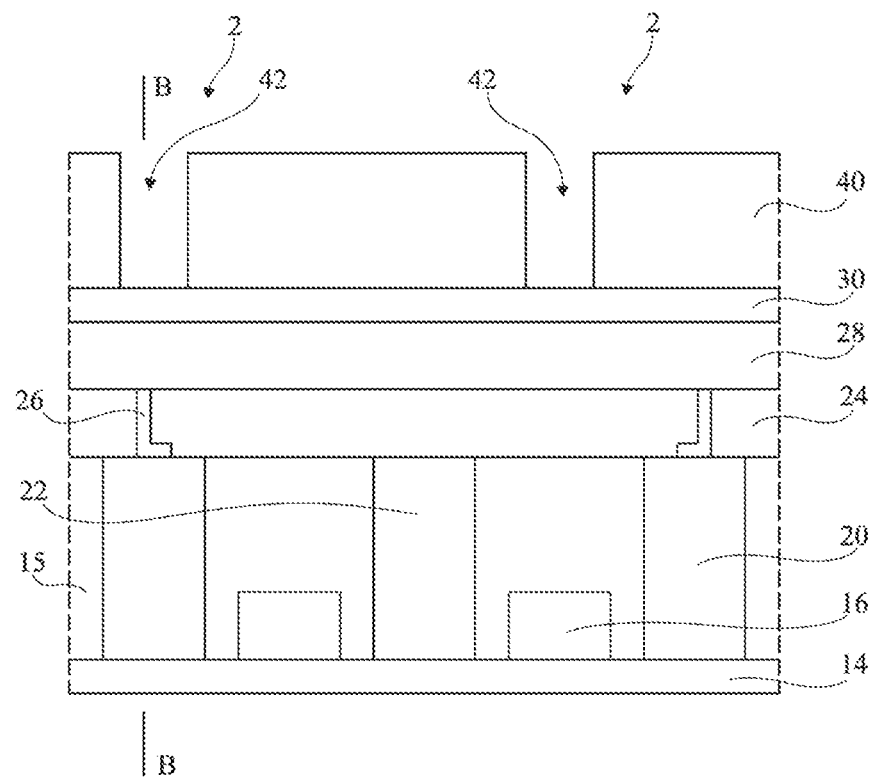
FIG. 2A comprises a cross-section view along plane A-A of FIG. 2B and FIG. 2B comprises a cross-section view along plane B-B of FIG. 2A, illustrating the result of another step of an embodiment of a phase-change memory manufacturing method.
Figure 2B:
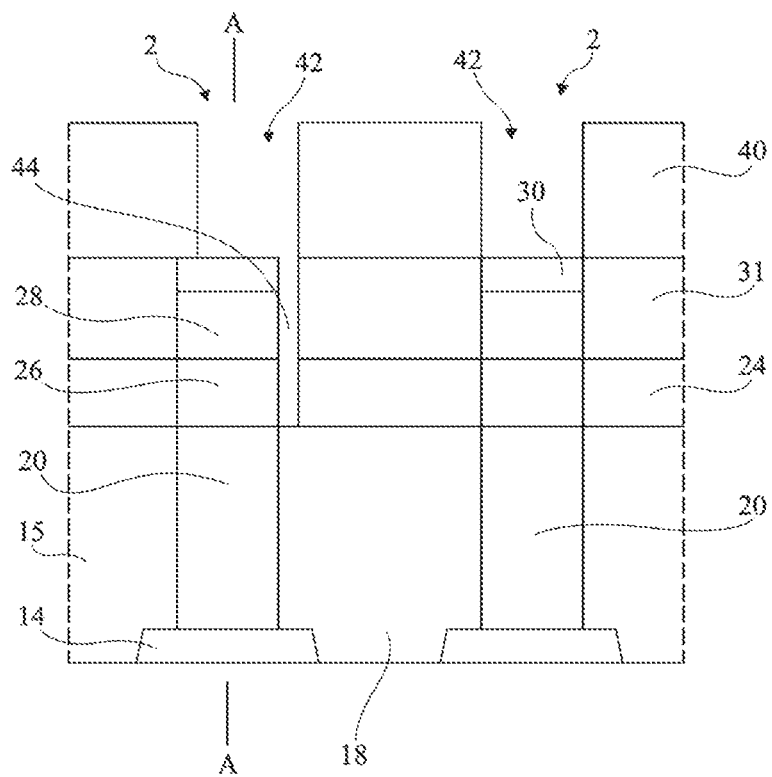

FIG. 2A comprises a cross-section view along plane A-A of FIG. 2B and FIG. 2B comprises a cross-section view along plane B-B of FIG. 2A, illustrating the result of another step of an embodiment of a phase-change memory manufacturing method.

During this step, a layer 40 is formed on the upper surface of insulating layer 31 and on the upper surface of strips 30 of conductive material. Layer 40 is an insulating layer, for example, made of silicon oxide or of silicon nitride.

Cavities or openings 42 are formed in insulating layer 40. Cavities 42 are thus formed after the forming of strips 28 of phase-change material. The cavities are, for example, cylindrical cavities. The cavities will enable to form conductive contacts with the bit lines, for example, to form conductive vias. The cavities extend from the upper surface of layer 40 to the level of the upper surface of strips 30. Each bit line will comprise a plurality of contacts. Each of the views of FIGS. 2A and 2B shows two cavities 42 which will each enable to form a conductive via. The two terminals of the phase-change memory cell will thus be contacts 20 and the contacts which will be formed in cavities 42.

Cavities 42 are located vertically in line with strips 30. The cavities 42 are located opposite strips 30 and not opposite insulating layer 31. However, the cavities may be offset, for example, when an etch mask is not correctly aligned or is not correctly formed.

In one embodiment, the etching is a selective etching of the material of insulating layer 40 over the material of strips 30. For example, the etching etches the material of layer 40 at least five times faster than the material of strips 31.

The duration of the etching of cavities 42 is selected to ensure that all the cavities reach strips 30, that is, to ensure that strips 30 form the bottoms of cavities 42.

When the cavities are offset, the etching thus risks lasting for a sufficiently long time to reach layer 31 and possibly layer 24.

In the example of FIG. 2B, the cavity 42 of the left-hand side of view is offset with respect to strip 30 and a secondary cavity or opening 44 is thus formed in layers 31 and 24. Cavity 42 thus comprises secondary cavity 44.

More generally, there may be a plurality of offset cavities 42 and thus a plurality of secondary cavities 44. For example, all the cavities may be offset, for example, due to an offset of the etch mask.

Strip 30 and resistive elements 28 are thus exposed during the etching. At least a portion of the walls of secondary cavity 44 is formed by the lateral walls of strips 30 and 28 and by the lateral walls of resistive elements 26.

The contacts could be formed by directly filling the cavities with a conductive material. However, secondary cavities 44 would then also be filled with conductive material. There could then be a direct electric connection between strip 30 and one of the resistive elements, that is, a connection via the conductive material rather than via strip 28 of phase-change material. Such a connection would disturb the storage of data in the corresponding memory cell. In the case where secondary cavity 44 reaches no resistive element 26, it could however reach strip 28 of phase-change material. The connection could then heat the phase-change material during a data storage step, which could modify the state of strip 28 and in particular its resistance at the level of the memory cells. Such a resistance difference might cause disturbances in the reading of the stored data.

Further, it might be impossible to determine the presence of cavities 44 in the memory before the forming of the contacts.

In the example of FIG. 2B, the cavities, and thus the contacts, have horizontal dimensions substantially equal to those of strip 30. It may be chosen to form smaller contacts, for example, conductive vias to have more room for maneuver in case of a misalignment. However, the decrease in the contact dimensions may not be possible or may cause manufacturing issues, for example, an increase in manufacturing costs.

As a variation, cavities 42 may have the shape of trenches, to allow the forming of conductive bars. The conductive bars would, for example, enable to connect together all the memory cells of a word line or of a bit line. The steps described hereafter are identical in the case of cavities having the shape of trenches, or other shapes.

As a variation, the cavities may have different shapes. For example, at least some of cavities 42 may have a shape enabling to form conductive vias. Further, at least certain cavities 42 may have shapes enabling to form conductive bars. At least certain other cavities may have other shapes.

Figure 3A:
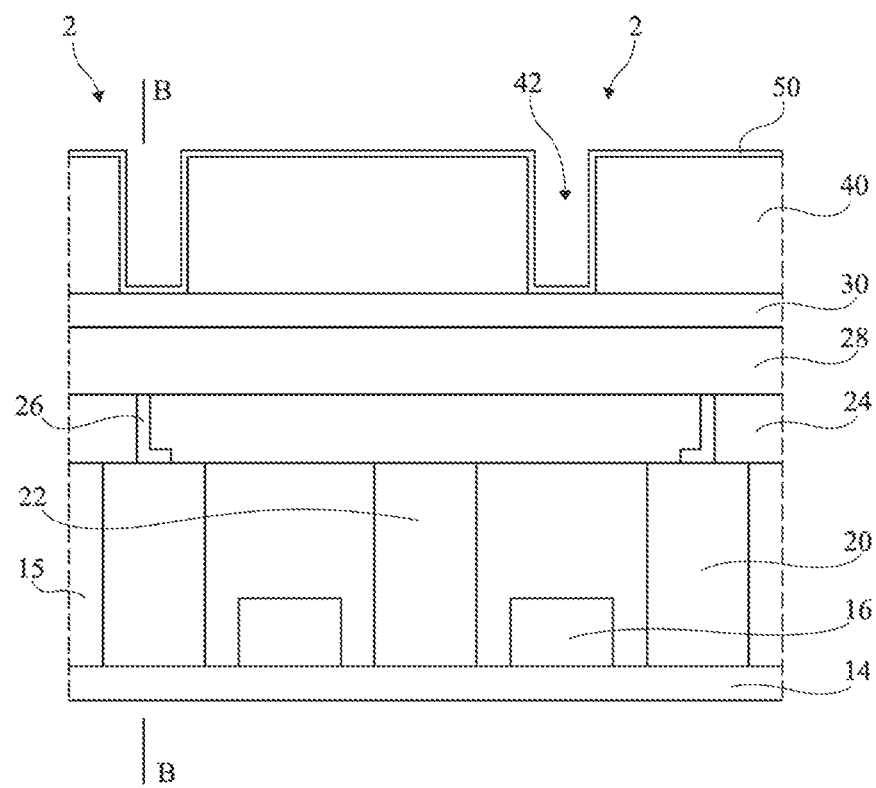
FIG. 3A comprises a cross-section view along plane A-A of FIG. 3B and FIG. 3B comprises a cross-section view along plane B-B of FIG. 3A, illustrating the result of another step of an embodiment of a phase-change memory manufacturing method.
Figure 3B:
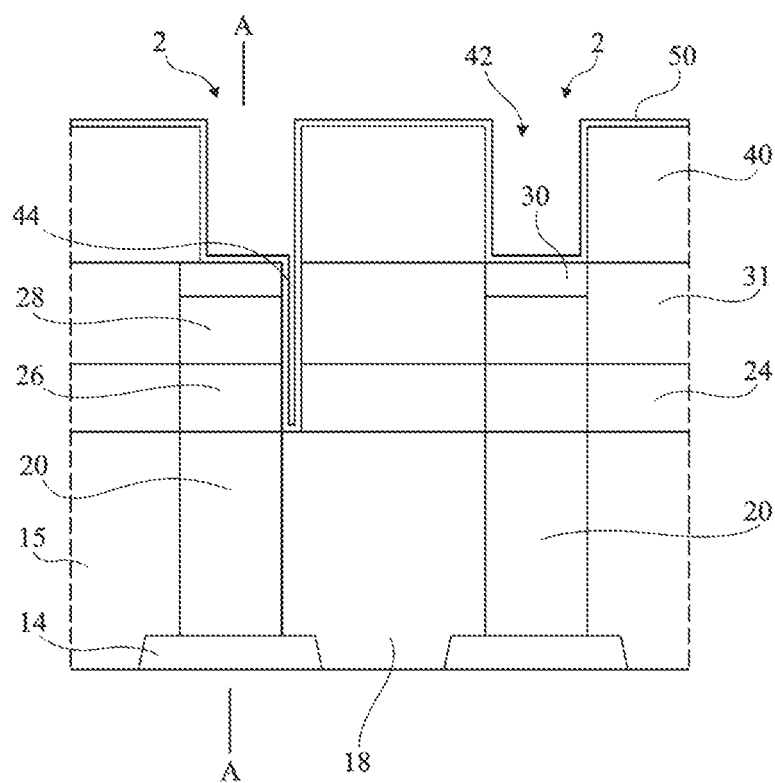

FIG. 3A comprises a cross-section view along plane A-A of FIG. 3B and FIG. 3B comprises a cross-section view along plane B-B of FIG. 3A, illustrating the result of another step of an embodiment of a method of manufacturing a phase-change memory.

During this step, an insulating layer 50 is formed on the structure described in relation with FIG. 2B. Layer 50 is, for example, conformally deposited or formed on the structure, that is, it covers all the surfaces accessible from the upper surface of the structure. In particular, layer 50 extends on the upper surface of layer 40, on the walls and on the bottom of cavities 42 and on the walls and the bottom of secondary cavities 44. Layer 50 thus extends on the exposed portions of strips 30 and 28 and on the exposed portions of resistive elements 26.

Layer 50 may possibly totally fill secondary cavity 44.

Layer 50 for example has a thickness in the range from approximately 2 nm to approximately 5 nm. Secondary cavity 44 may then totally fill cavities having a horizontal dimension, in the plane of view shown in FIG. 3B, in the range from approximately 4 nm to approximately 10 nm.

In one embodiment, the thickness of layer 50 is greater than the thickness of strips 30.

Figure 4A:
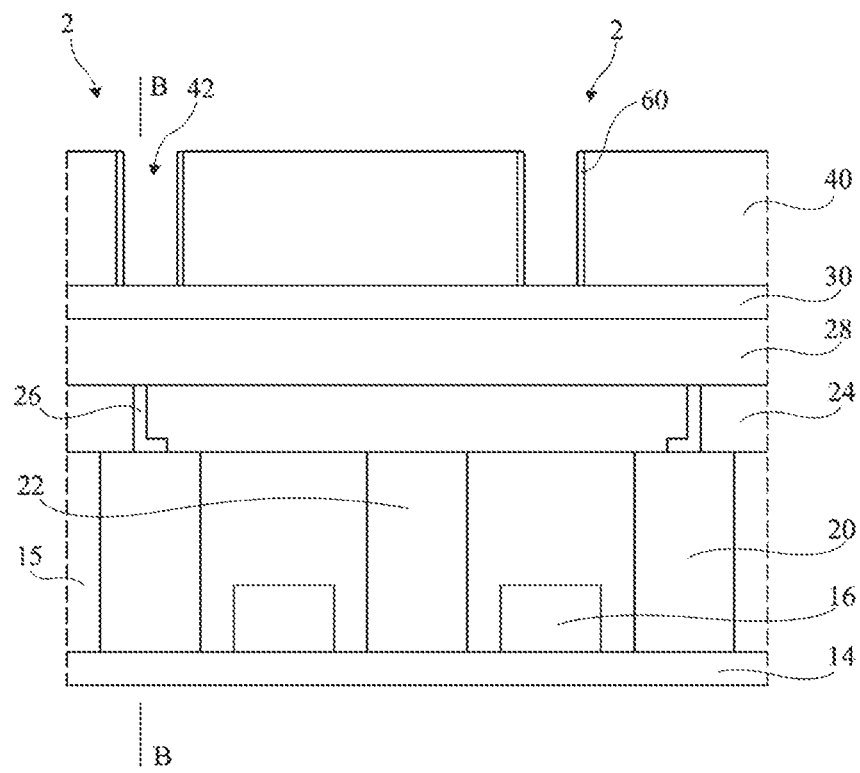
FIG. 4A comprises a cross-section view along plane A-A of FIG. 4B and FIG. 4B comprises a cross-section view along plane B-B of FIG. 4A, illustrating the result of another step of an embodiment of a phase-change memory manufacturing method.
Figure 4B:
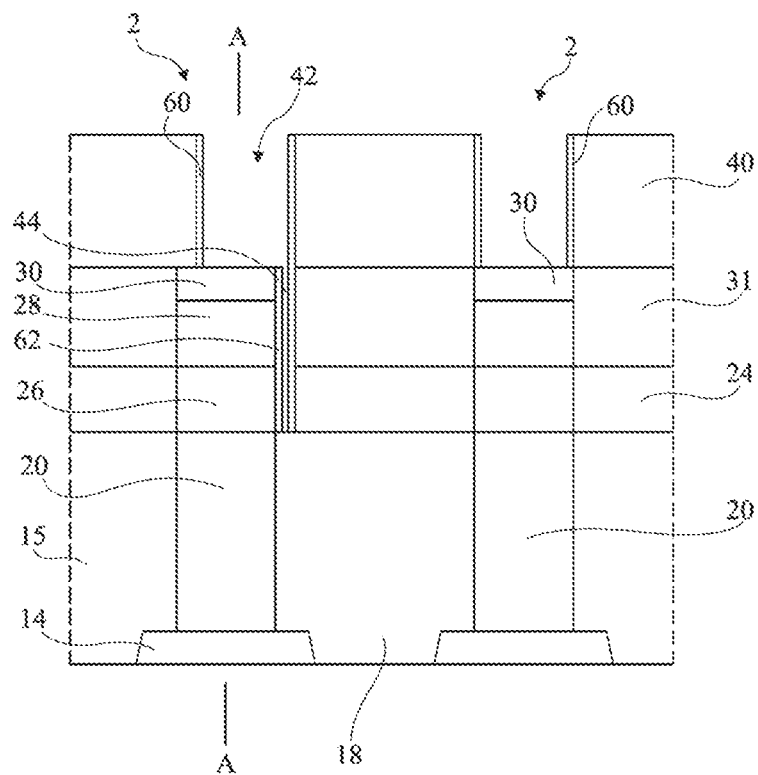

FIG. 4A comprises a cross-section view along plane A-A of FIG. 4B and FIG. 4B comprises a cross-section view along plane B-B of FIG. 4A, illustrating the result of another step of an embodiment of a method of manufacturing a phase-change memory.

During this step, an etching is performed. This etching is, for example, a selective etching of the material of layer 50 over the material of strip 30.

For example, the method etches the material of layer 50 at least five times faster than it etches the material of layer 30.

In one embodiment, the etching is an anisotropic etching, that is, an etching which etches in the vertical direction. Thus, the horizontal portions of layer 50 located at the bottom of cavities 42 and 44 are etched. Further, the horizontal portions of layer 50 located on the upper surface of layer 30 are etched. Layer 50 is thus, after etching, present on the lateral walls of cavities 42 and 44.

The portions of strips 30 forming the bottom of the cavities are thus exposed. It will thus be possible to form an electric connection with the upper surface of strips 30.

The vertical portions of layer 50, that is, the portions 60 located on the walls of cavities 42 and the portions 62 located on the walls of cavities 44, are not etched. In particular, the portions 62 located on the lateral walls of strips 30 and 28 and on the lateral walls of the resistive elements are not etched. Thus, the lateral walls of strips 30 and 28 and the lateral walls of resistive elements 26 are not exposed.

The etching may possibly remove an upper portion of horizontal portions 62 covering the lateral walls of cavities 44. For example, a portion of the lateral walls of strip 30 may be exposed. In one embodiment, the thickness of layer 50 is greater than the thickness of strips 30. Thus, when the etching removes a thickness of material of layer 50 substantially equal to the thickness of layer 30, portions 62 cannot be etched along the entire height of strip 30. The etching thus does not risk exposing a portion of the lateral walls of strip 28 and/or of conductive elements 26.

Similarly, if cavity 44 is totally filled with insulating layer 50, the etching may remove an upper portion of insulating layer 50 located in cavity 44, but not sufficiently to reach strip 28.

Figure 5A:
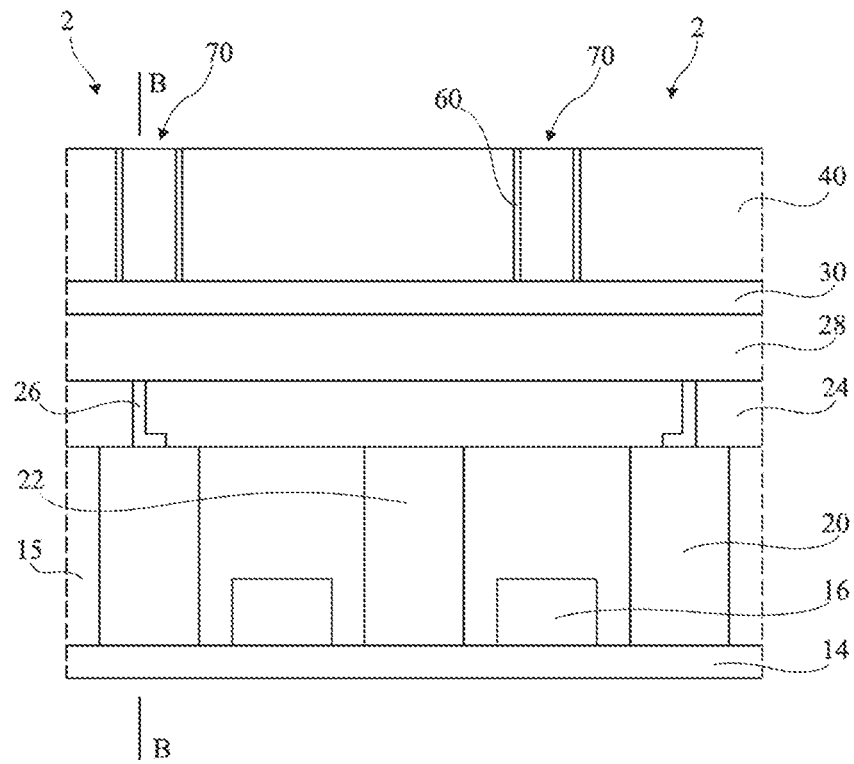
FIG. 5A comprises a cross-section view along plane A-A of FIG. 5B.
Figure 5B:
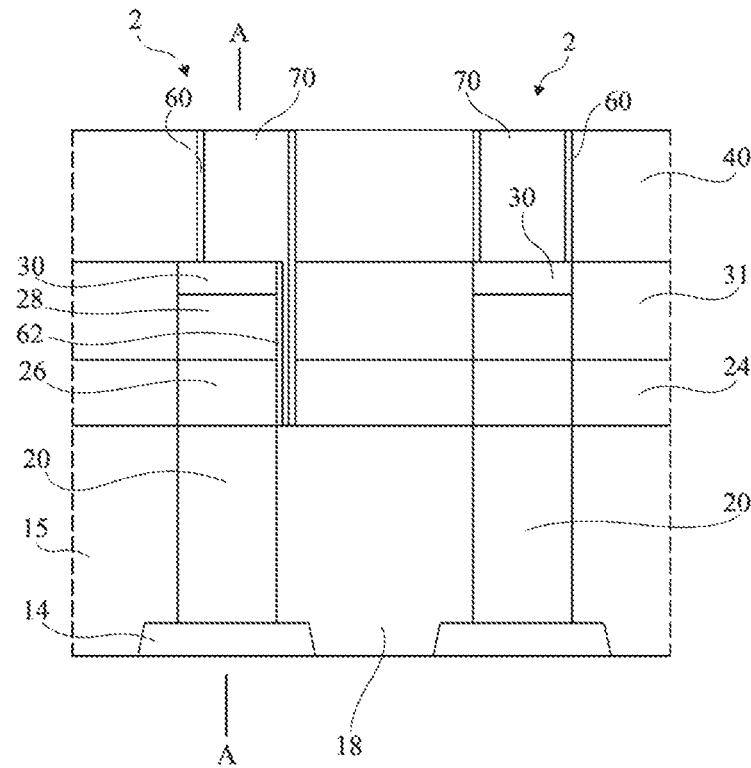
FIG. 5B comprises a cross-section view along plane B-B of FIG. 5A, illustrating the result of another step of an embodiment of a phase-change memory manufacturing method.

FIG. 5A comprises a cross-section view along plane A-A of FIG. 5B and FIG. 5B comprises a cross-section view along plane B-B of FIG. 5A, illustrating the result of another step of an embodiment of a phase-change memory manufacturing method.

During this step, cavities 42, and possible cavities 44 if they are not filled with insulating layer 50, are filled with a conductive material, for example, copper, to form contacts 70. Contacts 70 are, in the shown example, conductive vias, but might also be conductive bars or other conductive elements. There thus is an electric connection between contacts 70 and strips 30. There however is no electric contact between contacts 70 and strips 28 and resistive elements 26.

As a variation, contacts 70 may have horizontal dimensions greater than the horizontal dimensions of strip 30. Thus, it is possible for cavities 44 to be created on both sides of strips 28 and 30. The previously-described method steps apply in the same way.

An advantage of the previously described embodiments is that they enable to obtain phase-change memories comprising contacts which form no short-circuit and which are not in direct electric connection with phase-change material 28 or resistive elements 26.

Another advantage of the described embodiments is that they enable to obtain contacts 70 with no short-circuit even when the contacts are offset.

Another advantage of the described embodiments is that they enable to have lower restrictions on the dimension of contacts 70. Indeed, the described embodiments may comprise contacts 70 having larger horizontal dimensions than the dimensions of strips 28 of phase-change materials.

Various embodiments and variations have been described. It will be understood by those skilled in the art that certain features of these various embodiments and variations may be combined, and other variations will occur to those skilled in the art.

Such alterations, modifications, and improvements are intended to be part of this disclosure, and are intended to be within the spirit and the scope of the present disclosure. Accordingly, the foregoing description is by way of example and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method of manufacturing a phase-change memory, comprising:
    forming a transistor on a substrate;
    forming a first insulating layer on the transistor;
    forming a conductive via extending through the first insulating layer;
    forming a second insulating layer on the first insulating layer;
    forming a resistive element on the conductive via, the resistive element extending through the second insulating layer;
    forming a layer of phase-change material on the resistive element;
    forming a conductive layer on the layer of phase-change material;
    forming a third insulating layer on the conductive layer;
    forming a cavity in the third insulating layer, the cavity directly overlying the layer of phase-change material; and
    forming a fourth insulating layer in the cavity.

2. The method of claim 1 wherein forming the fourth insulating layer includes forming the fourth insulating layer on sidewalls of the cavity and a base of the cavity.

3. The method of claim 2, further comprising:
    removing portions of the fourth insulating layer that are on the base of the cavity.

4. The method of claim 1 wherein forming the cavity includes exposing a surface of the conductive layer by removing portions of the third insulating layer.

5. The method of claim 4 wherein forming the cavity includes exposing a surface of the first insulating layer by removing portions of the second insulating layer.

6. The method of claim 1 wherein forming the cavity includes forming a secondary cavity having sidewalls, and a portion of the sidewalls of the secondary cavity is formed by the layer of phase-change material.

7. The method of claim 6 wherein a portion of the sidewalls of the secondary cavity is formed by the resistive element.

8. The method of claim 6 wherein forming the fourth insulating layer includes forming the fourth insulating layer on the sidewalls of the secondary cavity.

9. The method of claim 1, further comprising:
    forming a conductive contact in the cavity.

10. The method of claim 9 wherein the conductive contact is a conductive via.

11. The method of claim 9, wherein the conductive contact is a conductive bar.

12. The method of claim 1 wherein a thickness of the fourth insulating layer is greater than a thickness of the conductive layer.

13. The method of claim 1 wherein a thickness of the fourth insulating layer is in a range from 2 nanometers to 5 nanometers.

14. A method of manufacturing a phase-change memory, comprising:
    forming a first insulating layer on a substrate;
    forming a strip of phase-change material on the substrate;
    forming a strip of conductive material on the strip of phase-change material;
    forming a second insulating layer on the first insulating layer and the strip of conductive material;
    forming a cavity in the second insulating layer and in the first insulating layer, a portion of the cavity directly overlies the strip of phase-change material; and
    forming a third insulating layer in the cavity and on sidewalls of the strip of phase-change material and the strip of conductive material.

15. The method of claim 14, further comprising:
    forming a transistor on the substrate;
    forming a fourth insulating layer on the transistor;
    forming a conductive via extending through the fourth insulating layer, the first insulating layer being on the fourth insulating layer;
    forming a resistive element on the conductive via, the resistive element extending through the first insulating layer, the strip of phase-change material being formed on the resistive element.

16. The method of claim 14, further comprising:
    removing portions of the third insulating layer that are located at a base of the cavity.

17. A method, comprising:
    forming a first insulating layer on a substrate;
    forming a resistive element extending in the first insulating layer;
    forming a second insulating layer on the first insulating layer;
    forming phase-change material on the resistive element and extending in the second insulating layer;
    forming a conductive layer on the phase-change material;
    forming a third insulating layer on the second insulating layer and the conductive layer;
    forming a cavity in the third insulting layer, the cavity having a sidewall that is the resistive element, the phase-change material, the first insulating layer, and the second insulating layer;
    forming a fourth insulating layer on the sidewall; and
    forming a contact in the cavity, a portion of the contact being spaced from the sidewall by the fourth insulating layer.

18. The method of claim 17, further comprising:
    forming a transistor on the substrate
    forming a fifth insulating layer on the transistor;
    forming a conductive via extending through the fifth insulating layer, the conductive via being electrically coupled to the transistor, the first insulating layer being on the fifth insulating layer, the resistive element being on the conductive via.

19. The method of claim 18, further comprising:
    forming conductive material on the phase-change material, the contact being on the conductive material.

20. The method of claim 17, further comprising:
    forming a fifth insulating layer on the third insulating layer, the cavity having another sidewall that is the fifth insulating layer, the forming of the fourth insulating layer including forming the fourth insulating layer on the another sidewall, another portion of the contact being spaced from the another sidewall by the fourth insulating layer.

\* \* \* \* \*

UNITED STATES PATENT AND TRADEMARK OFFICE
CERTIFICATE OF CORRECTION

| | |
|---|---|
| PATENT NO. | : 11,800,821 B2 |
| APPLICATION NO. | : 17/856711 |
| DATED | : October 24, 2023 |
| INVENTOR(S) | : Philippe Boivin et al. |

It is certified that error appears in the above-identified patent and that said Letters Patent is hereby corrected as shown below:

On the Title Page

Item (30) Foreign Application Priority Data should read:
--(30) Foreign Application Priority Data:
May 28, 2019 (FR)..........1905665--

In the Claims

Column 8, Claim 17, Line 44:
"third insulting layer," should read: --third insulating layer,--

Column 8, Claim 18, Line 53:
"on the substrate" should read: --on the substrate;--

Signed and Sealed this
Twentieth Day of February, 2024

Katherine Kelly Vidal
*Director of the United States Patent and Trademark Office*